(12) United States Patent
Scuteri

(10) Patent No.: US 7,505,548 B2
(45) Date of Patent: Mar. 17, 2009

(54) CIRCUITS AND METHODS FOR PROGRAMMABLE INTEGER CLOCK DIVISION WITH 50% DUTY CYCLE

(75) Inventor: Jeremy Scuteri, Highland, NY (US)

(73) Assignee: Seiko Epson Corporation, Tokyo (JP)

( * ) Notice: Subject to any disclaimer, the term of this patent is extended or adjusted under 35 U.S.C. 154(b) by 130 days.

(21) Appl. No.: 11/756,461

(22) Filed: May 31, 2007

(65) Prior Publication Data

US 2008/0297209 A1 Dec. 4, 2008

(51) Int. Cl.
*H03K 21/00* (2006.01)
(52) U.S. Cl. .................. 377/47; 377/48; 327/115; 327/117
(58) Field of Classification Search ............. 377/47, 377/48; 327/115, 117
See application file for complete search history.

(56) References Cited

U.S. PATENT DOCUMENTS

| | | | |
|---|---|---|---|
| 5,425,074 A * | 6/1995 | Wong | 377/47 |
| 5,510,742 A * | 4/1996 | Lemaire | 327/146 |
| 5,552,732 A | 9/1996 | Huang | |
| 5,557,649 A * | 9/1996 | Scheckel et al. | 377/48 |
| 6,121,801 A | 9/2000 | Lee | |
| 6,356,123 B1 | 3/2002 | Lee et al. | |
| 6,404,839 B1 | 6/2002 | Fong et al. | |
| 6,518,805 B2 * | 2/2003 | Tam et al. | 327/115 |
| 6,707,326 B1 | 3/2004 | Magoon et al. | |
| 6,707,327 B2 | 3/2004 | Choi et al. | |
| 7,012,455 B2 | 3/2006 | Chen | |

* cited by examiner

*Primary Examiner*—Tuan T Lam

(57) ABSTRACT

Circuits and methods and for dividing a frequency of an input signal by an integer divider value. The circuit generally comprises (a) a first frequency divider, including a first plurality of serially connected delay elements receiving the input signal and a first configurable feedback network, (b) a second frequency divider, including a second plurality of serially connected delay elements receiving an inverse of the input signal and a second configurable feedback network (c) configurable logic configured to select and/or combine outputs of the first and second frequency dividers and to produce a frequency divided output signal, and (d) a programmable circuit configured to selectably configure the first and second configurable feedback networks and the configurable logic. The present invention advantageously provides for a frequency divider structure that can be easily programmed to provide any integer divide ratio with a 50% duty cycle.

32 Claims, 8 Drawing Sheets

CIRCUITS AND METHODS FOR PROGRAMMABLE INTEGER CLOCK DIVISION WITH 50% DUTY CYCLE

FIELD OF THE INVENTION

The present invention generally relates to the field of clock dividers. More specifically, embodiments of the present invention pertain to circuits and methods for programmable integer clock dividers having outputs with a 50% duty cycle for both odd and even divide ratios.

DISCUSSION OF THE BACKGROUND

Computers and other electronic systems often require multiple clock signals. Often, it is desirable to produce multiple clock signals based on a single clock signal. One conventional method of generating multiple clock signals is to use a phase-locked loop (PLL). A PLL circuit may receive a clock signal as an input, and produce one or more output clock signals from the input clock signal. Another conventional method of generating multiple clock signals is to use a clock divider circuit. A clock divider circuit may be configured to receive an input clock signal and produce an output clock signal of a lower frequency. The output clock signal may be produced by dividing the input clock signal by a predetermined ratio. A typical clock divider circuit may include several flip-flop circuits, and may be able to divide an input clock signal by one of several even-integer ratios (e.g., 2, 4, 6, etc.).

These frequency dividers and frequency multipliers (e.g., PLLs) are used for many different applications. In particular, frequency dividers are used to reduce the overall number of oscillators required on a given semiconductor chip, thereby making available additional room on the chip for additional functional circuitry. Often, a single oscillator circuit is provided that generates a master clock signal. One or more frequency dividers and/or multipliers are then used to generate clock signals having different frequencies. For example, one or more divide-by-two circuits may be used to divide the master oscillator clock frequency by a factor of 2, 4, 8, etc. Often, it is desirable to programmably divide the clock signal (e.g., to select the divider ratio at runtime by providing or selecting one or more signals indicating the desired divider ratio). This may be accomplished by, for example, dynamically selecting one output from a plurality of clock divider circuit outputs, or by changing the operation of one clock divider circuit in response to the selected divider ratio.

On problem with many conventional clock circuits relates to their duty cycle. Clock signals produced by many conventional clock circuits and/or clock divider circuits do not have a 50% duty cycle (e.g. the duration of the positive or "on" portion of the signal may be appreciably longer or shorter than the duration of the negative or "off" phase of the signal, so that the signal is not "on" for substantially 50% of the time). This may be less of a concern for low frequency systems and/or systems which use only one clock edge for triggering devices. However, in some higher frequency systems some devices may be triggered by the positive edge of the clock signal, while other devices may be triggered by the negative edge. In such systems, it may be critical for the clock signal to have a 50% duty cycle. For example, when a clock signal has a 2 nanosecond (ns) period and a 50% duty cycle, devices triggered by either clock edge have 1ns to complete operations. However, if the clock signal is asymmetrical (e.g., having a duty cycle of 40% "on" and 60% "off") then devices triggered by of one clock edge may have less time to complete operations than devices triggered by the opposite clock edge. This may have a limiting effect when attempting to design systems that will utilize both clock edges for triggering devices.

Many clock divider circuits are configured primarily for dividing an input clock signal by an even-integer ratio (e.g., 2, 4, 6, etc.), as it is considered easier than dividing by an odd-integer ratio. Clock divider circuits that divide by odd-integer ratios are known in the art, but these circuits are often unable to achieve a duty cycle of 50%. Referring now to FIG. 1, a clock signal 101 is shown. Divided clock signal 102 is an output of a conventional divide-by-three clock divider employing counters or cascaded flip-flops. It can be seen that the duty cycle of signal 102 is approximately 66% (e.g., "on" for two input clock cycles and "off" for one input clock cycle). Such clock signals may be unsuitable for systems utilizing both clock edges, or where a 50% duty cycle is critical for other reasons. Furthermore, many conventional clock divider circuits require an input clock signal with a duty cycle of 50% in order to produce a duty cycle of 50% for odd-integer divider ratios Therefore, a need exists to provide methods and circuits for programmable integer clock division with a 50% duty cycle for odd and even divide ratios. Furthermore, it is desirable to provide such clock division even when the input clock signal does not have a 50% duty cycle, and to use standard integrated circuit components.

SUMMARY OF THE INVENTION

Embodiments of the present invention relate to circuits and methods and for dividing a frequency of an input signal by an integer divider value. The circuit generally comprises a first frequency divider, a second frequency divider, a configurable logic for selecting an output signal, and a programmable circuit for configuring the dividers and the selection circuit. The first frequency divider includes (i) a first delay block (e.g., a first delay block having a plurality of serially connected delay elements) configured to receive the input signal and (ii) a first configurable coupling circuit configured to couple one or more first outputs of the first delay block to a first delay block input (e.g., an input of a first element in of the plurality of delay elements). The second frequency divider includes (i) a second delay block (e.g., a second delay block having a plurality of serially connected delay elements) configured to receive an inverse of the input signal and (ii) a second configurable coupling circuit configured to couple one or more first outputs of the second delay block to second delay block input (e.g., an input of a first element in of the plurality of delay elements). The configurable logic is configured to select a second output of the first delay block and a second output of the second delay block and to produce a frequency divided output signal. The programmable circuit is configured to selectably configure the first and second configurable coupling circuits and the configurable logic.

In a preferred embodiment, the second frequency divider may be activated only when an odd divider value is selected. Thus, the configurable logic may be configured to disable the second frequency divider when the integer divider value is even, for example by disabling the inverter providing the inverse of the input signal to the second frequency divider.

In another embodiment, the configurable logic further comprises a combination circuit configured to combine the second outputs of the first and second delay blocks to produce a combined output. In a further embodiment, the configurable logic further comprises a multiplexer configured to output the combined output signal as the frequency divided output signal when the integer divider value is odd and to output the second output of the first delay block when the integer divider value is even. The combination circuit may also comprise a NAND logic gate (or its logical equivalent) having a first input coupled to the second output of the first delay block or a derivative thereof, a second input coupled to the second output of the second delay block or a derivative thereof, and an output configured to produce the combined output.

In a preferred embodiment, the first plurality of serially connected delay elements comprises N D-type flip-flops, where N is an integer of at least 2, the second plurality of serially connected delay elements comprises M D-type flip-flops, where M is an integer of at least 2 and less than or equal to N, and the integer divider value has a maximum value of N×2 and a maximum odd value of (M×2)−1. The second frequency divider may be substantially identical to the first frequency divider (e.g., M may equal N). However, if the maximum odd integer divider value for a particular application is significantly less than the maximum even integer divider values, then the second frequency divider may have fewer delay elements than the first frequency divider.

The selected integer divider value may be represented by the symbol K and is generally an integer of at least two. In one embodiment, when K is even, the first output of the first delay block comprises an output of an Ith one of the N D-type flip-flops, where I=K/2. When K is odd, the first output(s) of the first delay block comprise negative outputs of a Jth one and a (J+1)th one of the N D-type flip-flops, and the first output(s) of the second delay block comprises negative outputs of a Jth one and a (J+1)th one of the M D-type flip-flops. In such an embodiment, generally J=(K−1)/2. Thus, with a minimum even value K of two, and a minimum odd value K of three, I and J both have minimum values of one.

In a further embodiment, when K is odd the first configurable coupling circuit is configured to couple the negative outputs of the Jth one and the (J+1)th one of the N D-type flip-flops to the input of the first of the first delay block through a first AND logic gate and the second configurable coupling circuit is configured to couple the negative outputs of the Jth one and the (J+1)th one of the M D-type flip-flops to the input of the first of the second delay block through a second AND logic gate. Alternatively, when K is even, the first configurable coupling circuit may be configured to couple the output of the Ith one of the N D-type flip-flops to the input of the first of the first delay block through an inverter.

In a preferred embodiment, when the integer divider value is even, the frequency divided output signal has a duty cycle of 50% independent of the duty cycle of the input signal. When the integer divider value is odd, the frequency divided output signal has a duty cycle of 50% when the duty cycle of the input signal is 50%. When the integer divider value is odd and the input signal has a duty cycle that is not 50%, the frequency divided output signal has a duty cycle that is closer to 50% than the duty cycle of the input signal. In one exemplary embodiment, when the integer divider value is three and the input signal has a duty cycle of 33%, the frequency divided output signal has a duty cycle of at least 45%.

The method includes the steps of (a) producing a first divider output by (i) applying the input signal to a first delay block (e.g., a first delay block having a plurality of serially connected delay elements), (ii) selectively coupling one or more first outputs of the first delay block to a first delay block input (e.g., an input of a first delay element in the first delay block), and (iii) selecting the first divider output from a second output of the first delay block, (b) when the programmable integer divider value is odd, producing a second divider output by (i) applying an inverse of the input signal to a second delay block (e.g., a second delay block having a second plurality of serially connected delay elements), (ii) selectively coupling one or more first outputs of the second delay block to a second delay block input (e.g., an input of a first delay element in the second delay block), and (iii) selecting the second divider output from a second output of the second delay block, and (c) producing a frequency divided output signal based on the first divider output and/or the second divider output in accordance with the integer divider value.

The method may include a step of receiving a selection signal corresponding to the selected integer divider value (e.g., so that the divider ratio produced by the method can be changed during operation). In a preferred embodiment, the method includes deactivating the second delay block when the selected integer divider value is even, for example by disabling and/or deactivating the inverter providing the inverse of the input signal to the second delay block.

In a further embodiment, when K is even, step (a)(ii) comprises coupling an output of an Ith one of the N D-type flip-flops to the first delay block input, where I=K/2. In a preferred embodiment, the Ith output is coupled to the first delay block input by activating an inverter in response to the selected integer divider value, where the inverter has an input coupled to the Ith output and an output coupled to the first delay block input. In a preferred embodiment, the inverter is a tri-state inverter.

In another embodiment, when K is odd, step (a)(ii) comprises coupling negative outputs of a Jth one and a (J+1)th one of the N D-type flip-flops to the first delay block input; and step (b)(ii) comprises coupling negative outputs of a Jth one and a (J+1)th one of the M D-type flip-flops to the input of the second delay block input, where J=(K−1)/2. In a further embodiment, step (a)(ii) comprises (1) performing a first AND logical operation on negative outputs of a Jth one and a (J+1)th one of the N D-type flip-flops, and (2) providing an output of the first AND operation or a derivative thereof to the first delay block input, and step (b)(ii) comprises (1) performing a second AND logical operation on negative outputs of a Jth one and a (J+1)th one of the M D-type flip-flops, and (2) providing an output of the second AND operation or a derivative thereof to the second delay block input.

In yet another embodiment, when K is odd, step (c) may include performing a NAND logical operation on the first divider output and the second divider output and producing an output of the NAND logical operation or a derivative thereof as the frequency divided output signal. Alternatively, when K is even, step (c) may include producing the first divider output or a derivative thereof as the frequency divided output signal.

The present invention advantageously provides for a frequency divider structure that can be easily programmed to provide any integer divide ratio with a 50% duty cycle including odd divide ratios. For even integer divide ratios the output has a 50% duty cycle independent of the input clock duty cycle. For odd integer divide ratios the output has a 50% duty cycle when the input clock has a 50% duty cycle, and the output has an improved duty cycle when the input clock does not have a 50% duty cycle. The circuits and methods can be implemented using standard logic cells such as D-type flip-flops and basic logic gates, and can be easily scaled to provide any integer divide ratio that is desired.

These and other advantages of the present invention will become readily apparent from the detailed description of preferred embodiments below.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Furthermore, for the sake of convenience and simplicity, the terms "clock," "time," "rate," "period" and "frequency" are generally used interchangeably herein, but are generally given their art-recognized meanings. Also, for convenience and simplicity, the terms "signal" and "waveform" may be used interchangeably, as may the terms "connected to," "coupled with," "coupled to," and "in communication with" (which terms also refer to direct and/or indirect relationships between the connected, coupled and/or communication elements unless the context of the term's use unambiguously indicates otherwise), but these terms are also generally given their art-recognized meanings.

The invention, in its various aspects, will be explained in greater detail below with regard to exemplary embodiments.

An Exemplary Circuit

Figure 1:
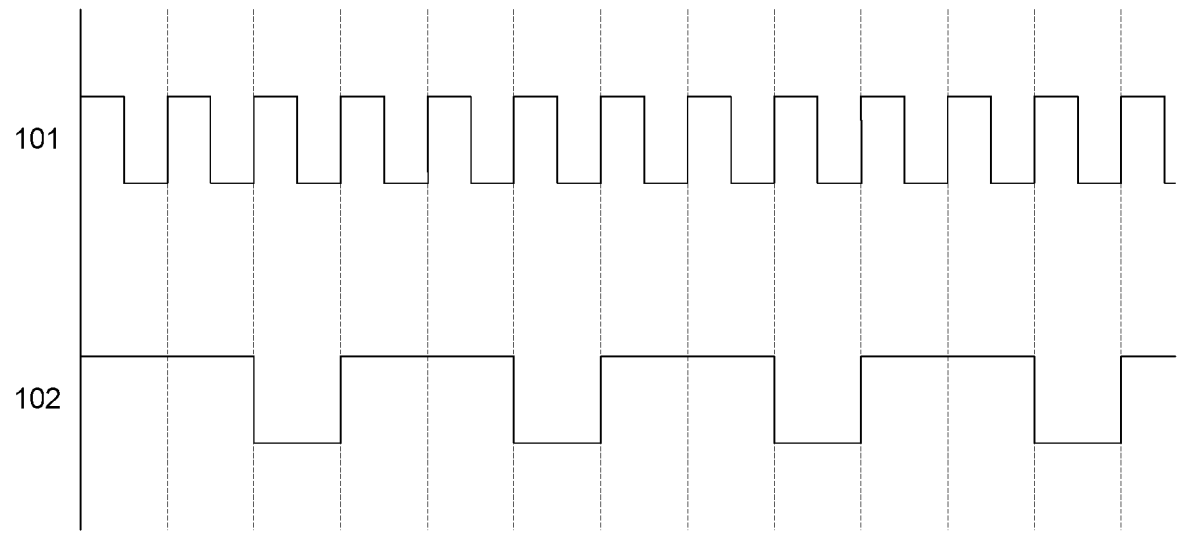
FIG. 1 is a graph showing a waveform of an input clock and an output of a conventional divide-by-three clock divider.
Figure 2:
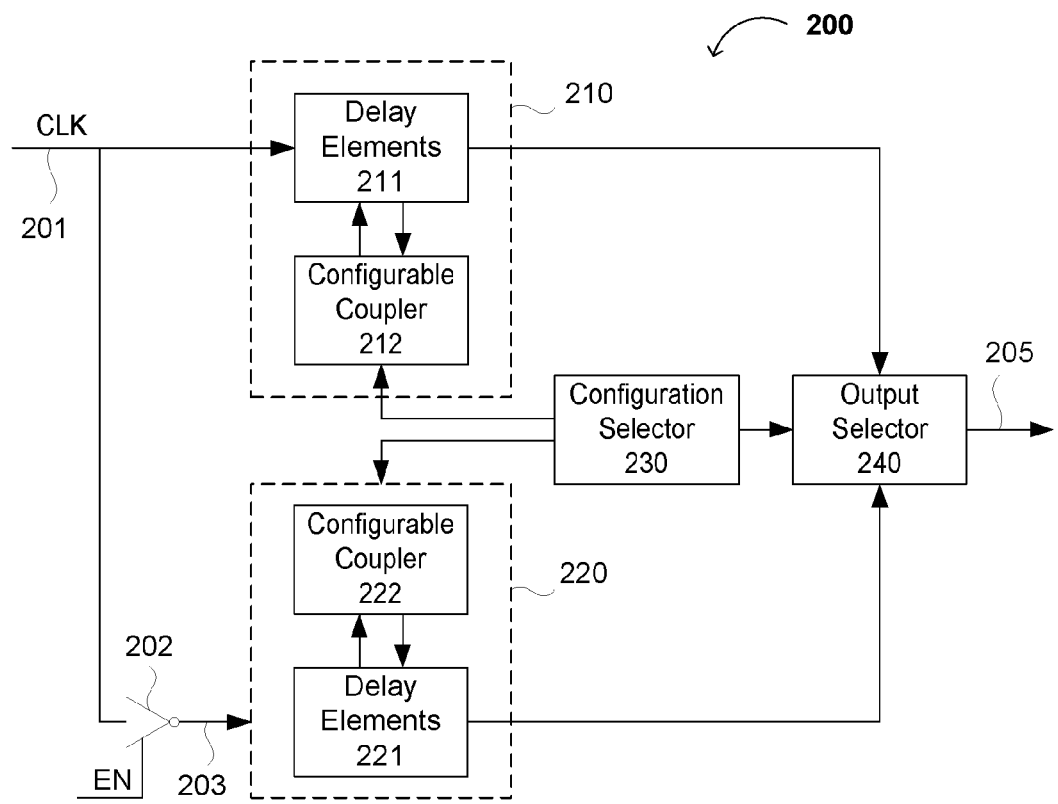
FIG. 2 is a block diagram of an exemplary circuit for dividing an input clock signal according to the present invention.

Referring now to FIG. 2, a block diagram of a circuit 200 for dividing the frequency of an input signal by an integer divider value is shown. Circuit 200 includes first frequency divider 210, second frequency divider 220, configuration selector 230, and output selector 240. First frequency divider 210 includes delay elements 211 (e.g., a plurality of serially connected delay elements) configured to receive the input clock signal 201 and configurable coupler 212. Configurable coupler 212 is generally configured to couple one or more outputs of delay elements 211 to an input of a first one of the of the delay elements. Second frequency divider 220 includes delay elements 221 configured to receive an inverse or complement of input clock signal 201 (e.g., inverted clock signal 203 from inverter 202) and configurable coupler 222. Similar to coupler 212, coupler 222 is configured to couple one or more outputs of the second plurality of delay elements to an input of a first one of delay elements 221.

Output selector 240 is generally configured to select an output of delay elements 211 and an output of delay elements 221 and output a frequency divided signal 205. Configuration selector 230 is generally configured to selectably configure the first and second configurable coupling circuits 212 and 222 and the output selector 240. For example, configuration selector 230 may include an input for selecting the desired integer divider value. The configuration selector input may comprise, for example a selector input for each possible integer divider value, a serial or parallel representation of the desired integer divider value, or any other input value for configuring the operation of divider circuit 200.

The second frequency divider 220 is generally activated only when an odd divider value is selected. Thus, in a further embodiment the configuration selector 230 is configured to disable the second frequency divider 220 when the integer divider value is even. Alternatively, configuration selector 230 may be configured to disable the second frequency divider by disabling inverter 202.

Figure 3A:
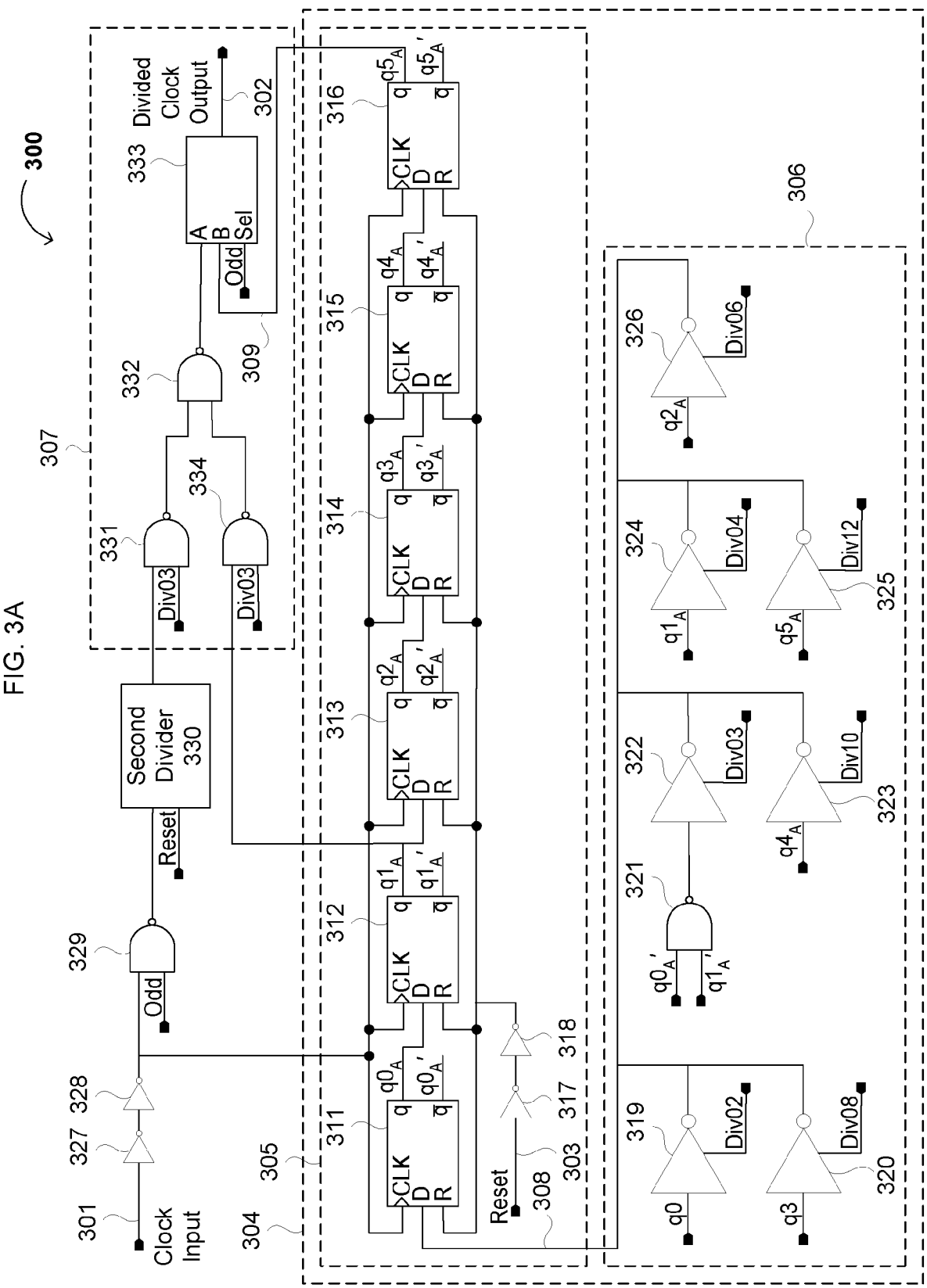
FIG. 3A is a circuit diagram of an exemplary circuit for dividing an input clock signal according to the present invention.

Referring now to FIG. 3A, a more detailed circuit diagram of an exemplary circuit 300 for dividing an input clock signal according to the present invention is shown. Circuit 300 has a first frequency divider 304 including first plurality of serially connected delay elements 305 and configurable coupling circuit 306. Delay elements section/block 305 includes six D-type flip-flops (DFFs) 311 to 316. DFFs 311 to 316 receive the input clock signal 301 at their CLK inputs. DFFs 312 to 316 have D inputs coupled to the positive output of preceding DFFs 311 to 315, respectively. First DFF 311 has its D input coupled to output signal 308 of configurable coupling circuit 306. Configurable coupling circuit 306 forms a digital feedback network configured to couple one or more first outputs of DFFs 311 to 316, depending on the state of configuration lines Div02-Div12. Configuration lines Div02-Div12 may be provided, for example, by a programmable circuit such as configuration selector 230 of FIG. 2, configured to selectably configure the coupling circuit 306. The programmable circuit may comprise, for example, non-volatile memory (e.g., EPROM, flash memory, fuses, etc.) or RAM (e.g., configuration registers, programmable memory bits generally not accessible by the user, etc.).

Second frequency divider 330 may be substantially identical to the first frequency divider 304. However, if the maximum odd integer divider value for a particular application is significantly less than the maximum even integer divider values, then the second frequency divider may have fewer delay elements than the first frequency divider. Second frequency divider 330, receives an inverted input clock signal (e.g., the output of NAND gate 329). Output selector circuit 307 is configured to select an output from delay elements 305 and an output of the delay elements of second divider 330, and produce a frequency divided output signal 302.

The first frequency divider can produce output clock signals with a 50% duty cycle for even integer divider ratios without second divider 330. Thus, second frequency divider 330 is generally activated only when an odd divider value is selected (e.g., when the "Odd" input is high, which may be provided by a programmable logic such as configuration selector 230 of FIG. 2). In circuit 300 the "Odd" signal and the input clock signal 301 are provided as inputs to NAND gate 329. Thus, when the "Odd" signal is low, the output of NAND gate 329 is pulled high, thereby disabling second divider circuit 330. When the "Odd" signal is high the output of NAND gate 329 comprises an inverted input clock signal provided to second divider 330.

Therefore, for even divider ratios the operation of circuit 300 can be illustrated with respect to delay elements 305 and coupler circuit 306 of the first frequency divider 304. DFFs 311-316 are cascaded D-type flip flops, and the elements of coupler circuit 306, combined with DFFs 311-316, form a programmable digital feedback network. By switching on and off the tri-state buffers in circuit 306 (e.g., tri-state buffers 319, 320, 323, 324, 325, and 326), all available even integer divide ratios can be realized. These divide ratios have inherent 50% duty cycles independent of the duty cycle of the input clock waveform.

Figure 4A:
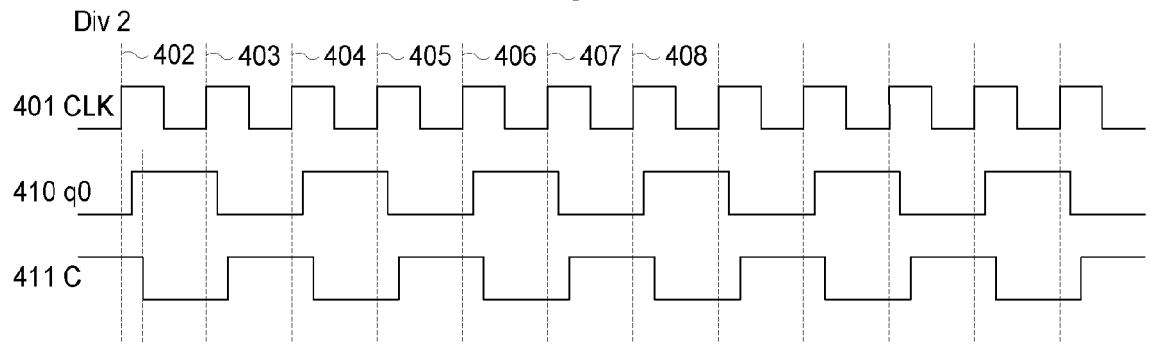
FIGS. 4A-4G are graphs showing waveforms produced by circuits and methods according to the present invention.

By connecting the positive output $q0_A$ of DFF 311 through inverter 319 (e.g., when the "Div02" input is high, which may be provided by a programmable logic such as configuration selector 230 of FIG. 2) to the D input of DFF 311, a divide ratio of two is realized. Referring now to FIG. 4A, a graph of waveforms when the divide ratio is two is shown. Waveform 401 is the input clock signal 301, waveform 410 is the positive output $q0_A$ of DFF 311, and waveform 411 is the coupler output signal 308, provided by inverter 319 when the "Div02" signal is high. At each rising edge of waveform 401 (e.g., at times 402, 403, 404, etc.), DFF 311 samples the control line 308. Thus, at time 402, DFF 311 samples control line 308, which is high. Therefore, after a short delay, DFF 311 produces a high output at its positive output $q0_A$. As a result, coupler output 308 (represented by waveform 411) is pulled low by inverter 319. At the next rising edge of waveform 401 (e.g., at time 403), DFF 311 samples control line 308 and subsequently produces a low output at its positive output $q0_A$. As can be seen in waveform 410, the output of DFF 311 is a signal having a frequency that is one half of the input clock frequency with a duty cycle of 50%. The duty cycle of the input clock signal 301 is irrelevant because the operation of DFF 311 depends only on the rising edge of the clock signal. The output of DFF 311 is then propagated through the remaining DFFs 312-316 to produce first frequency divider output 309.

Figure 4B:
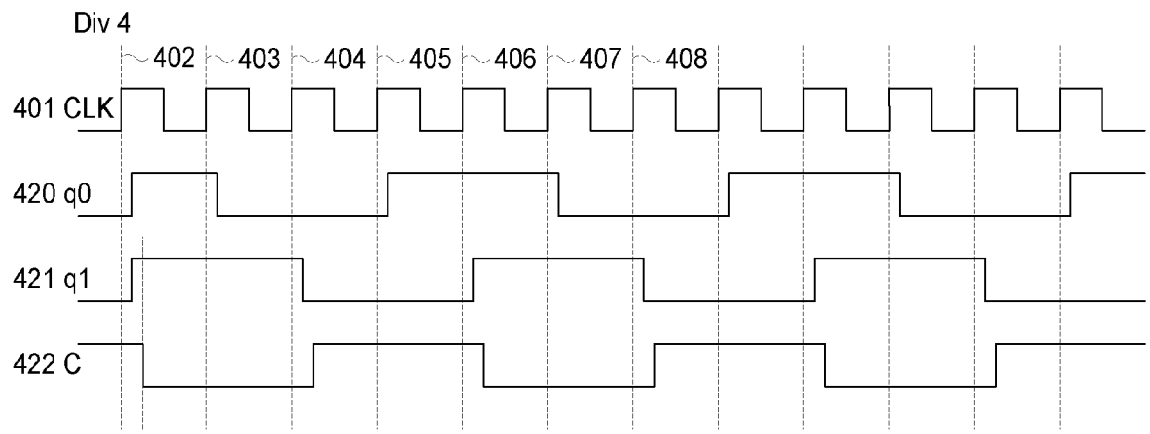

Referring again to FIG. 3A, a divide ratio of four is realized by connecting the positive output $q1_A$ of DFF 312 through inverter 324 (e.g., when the "Div04" input is high) to the D input of DFF 311. Referring now to FIG. 4B, a graph of waveforms produced when the divide ratio is four is shown. Waveform 401 represents the input clock signal 301. Waveforms 420 and 421 represent the positive outputs $q0_A$ and $q1_A$ of DFFs 311 and 312, respectively. Waveform 422 represents the coupler output 308, provided by inverter 324 when the "Div04" signal is high. As can be seen in waveforms 420 and 421, the outputs of DFFs 311 and 312 are signals having frequencies that are one-fourth of the frequency of input clock waveform 401 and a duty cycle of 50%. The output of DFF 312 is then propagated through the remaining DFFs 313-316 to produce the first frequency divider output 309.

Figure 4C:
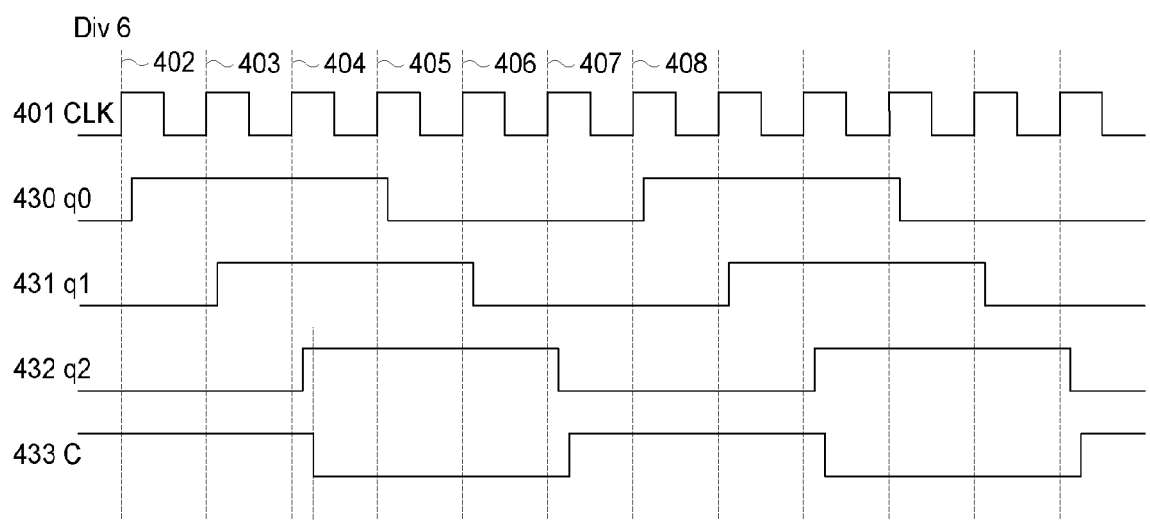

Referring again to FIG. 3A a divide ratio of six is realized by connecting the positive output $q2_A$ of DFF 313 through inverter 326 (e.g., when the "Div06" input is high) to the D input of DFF 311. Referring now to FIG. 4C, a graph of waveforms produced when the divide ratio is six is shown. Waveform 401 represents the input clock signal 301. Waveforms 430, 431, and 432 represent the positive outputs $q0_A$, $q1_A$ and $q2_A$ of DFFs 311, 312, and 313, respectively. Waveform 422 represents the coupler output 308, provided by inverter 326 when the "Div06" signal is high. As can be seen in waveforms 430, 431, and 432, the outputs of DFFs 311, 312 and 313 are signals having frequencies that are one-sixth of the frequency of input clock waveform 401 and a duty cycle of 50%. The output of DFF 313 is then propagated through the remaining DFFs 314-316 to produce the first frequency divider output 309.

Figure 4D:
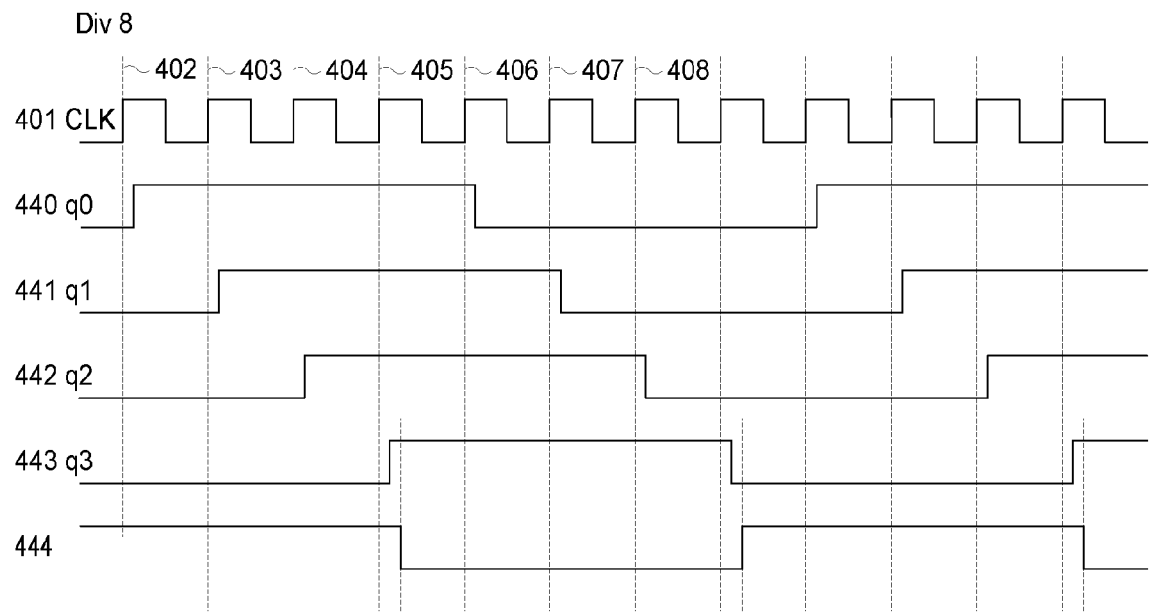
Figure 4E:
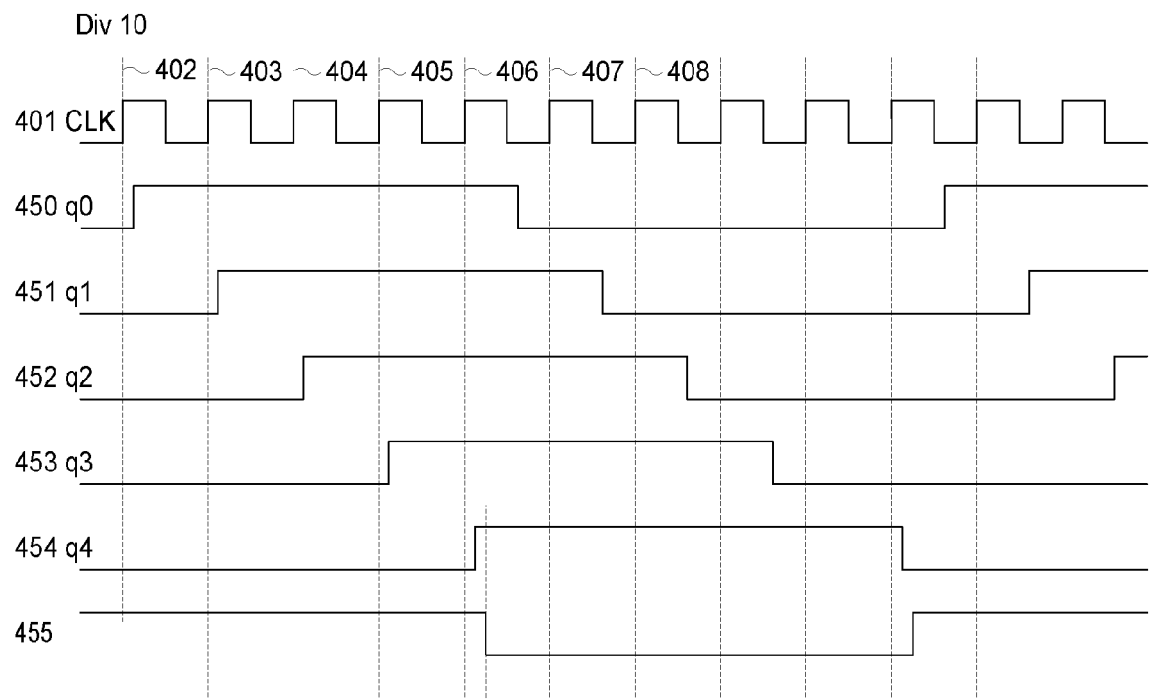
Figure 4F:
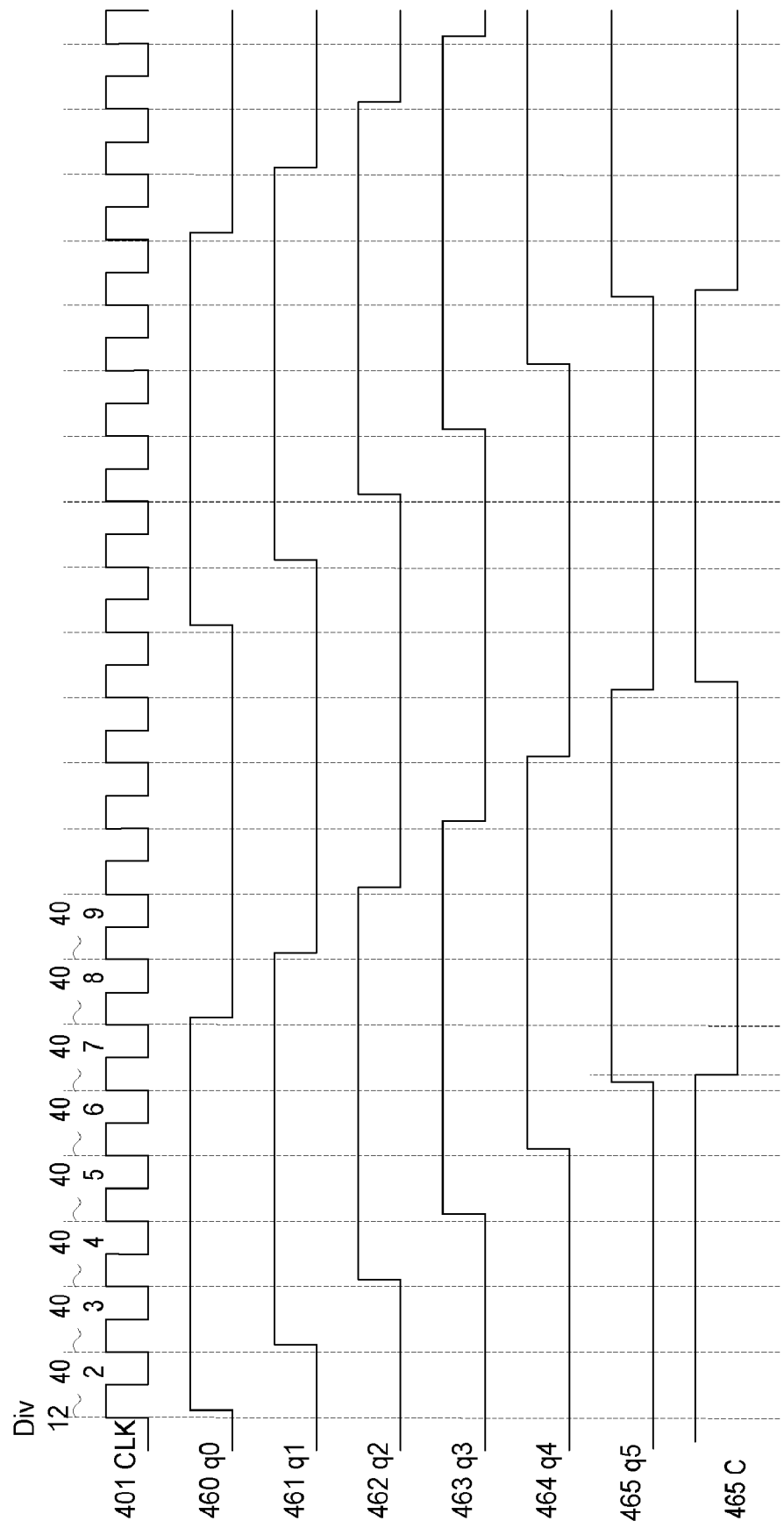

Similarly, FIG. 4D, FIG. 4E, and FIG. 4F are graphs of waveforms produced for divide ratios of eight, ten, and twelve, respectively (e.g., when the control signals "Div08," "Div10," and "Div12," respectively, are high). More generally, delay elements block 305 may contain N D-type flip-flops, where N is an integer, with a maximum divide ratio of N×2. A selected even divide ratio K can be realized by connecting the positive output of an Ith cascaded DFF to the D input of the first DFF (e.g., the D input of DFF 311), where I and K are integers and I=K/2. Thus, with a minimum even divide ratio K of two, N and I both have minimum values of one. For even divide ratios, the output values of the DFFs in delay block 305 are only changed only on a rising edge (or only falling edge, depending on the configuration of the DFFs) of the input clock signal 301. Thus, the present invention provides an output signal with a duty cycle of 50% for any even integer divider ratio.

Figure 4G:
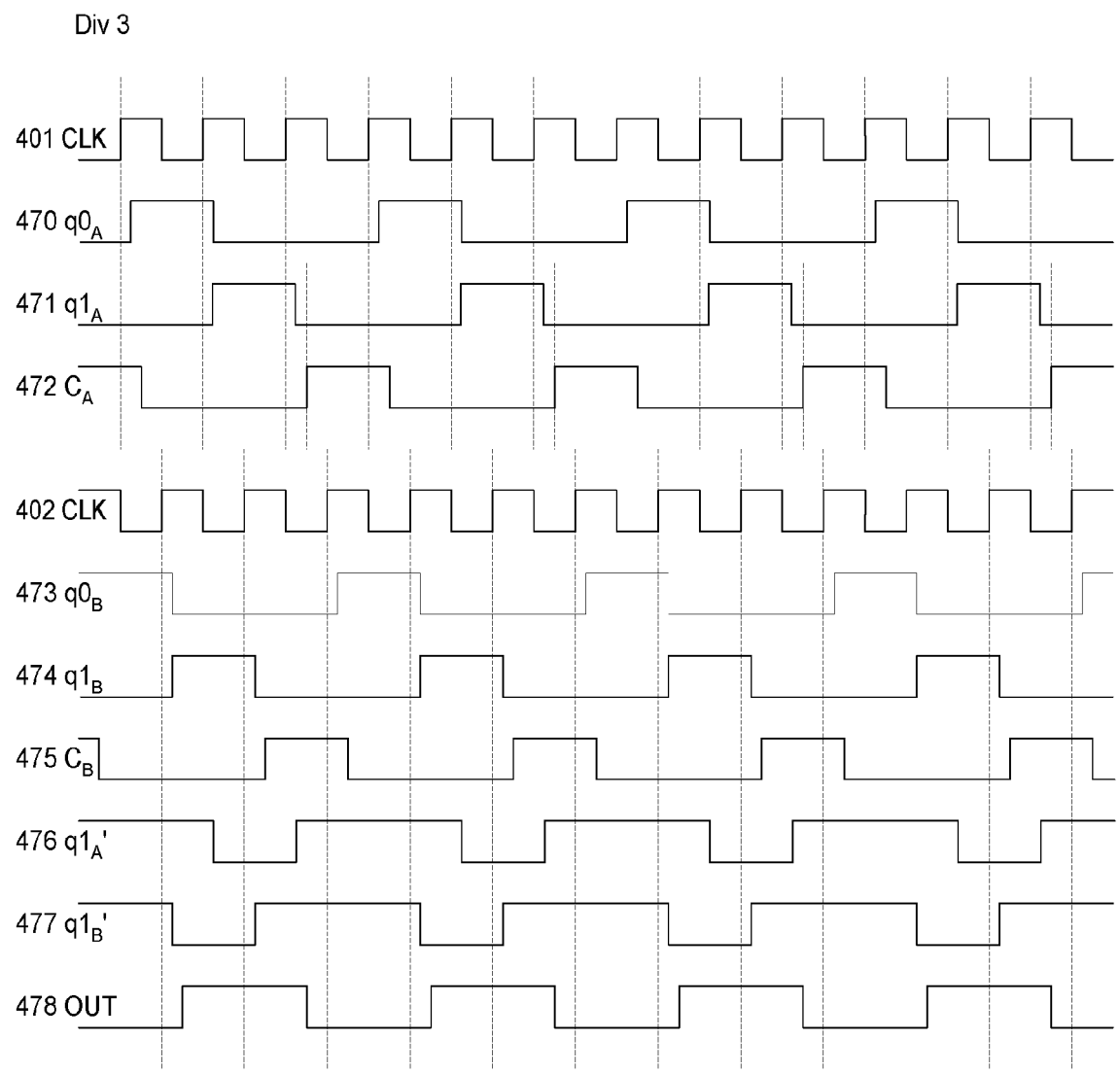

Odd integer divide ratios can also be realized using the present circuit 300. For example, a divide ratio of three is realized by connecting the negative outputs $q0_A'$ and $q1_A'$ of DFFs 311 and 312, respectively, through NAND gate 321 and tri-state inverter 322 (e.g., when the "Div03" input is high). Referring now to FIG. 4G, a graph of waveforms produced when the divide ratio is three is shown. Waveform 401 represents the input clock signal 301. Waveforms 470 and 471 represent the positive outputs $q0_A$ and $q1_A$ of DFFs 311 and 312, respectively. Waveform 472 represents the coupler output signal 308, provided by inverter 322 and NAND gate 321 coupled to negative outputs $q0_A'$ and $q1_A'$ of DFFs 311 and 312, respectively (thus performing a logical AND operation on negative outputs $q0_A'$ and $q1_A'$), when the "Div03" signal is high. As can be seen in waveforms 470 and 471, the outputs of DFFs 311 and 312 are signals having frequencies that are one-third of the input clock frequency. However, waveforms 470 and 471 do not have duty cycles of 50%.

In order to produce a divided clock signal with an odd divider ratio and a 50% duty cycle, second frequency divider 330 may be used. Second frequency divider 330 may have M D-type flip-flops, where M is an integer less than or equal to N, and the maximum odd divider ratio is (M×2)−1. The second frequency divider 330 may be substantially identical to the first frequency divider (e.g., M may equal N). However, if the maximum odd integer divider value for a particular application is significantly less than the maximum even integer divider values, then the second frequency divider may have fewer delay elements than the first frequency divider. Thus, with a minimum odd divide ratio K of three, N and M both have minimum values of two (e.g., in order achieve an odd divide ratio of three, the first and second delay blocks must have at least two delay elements each).

Figure 3B:
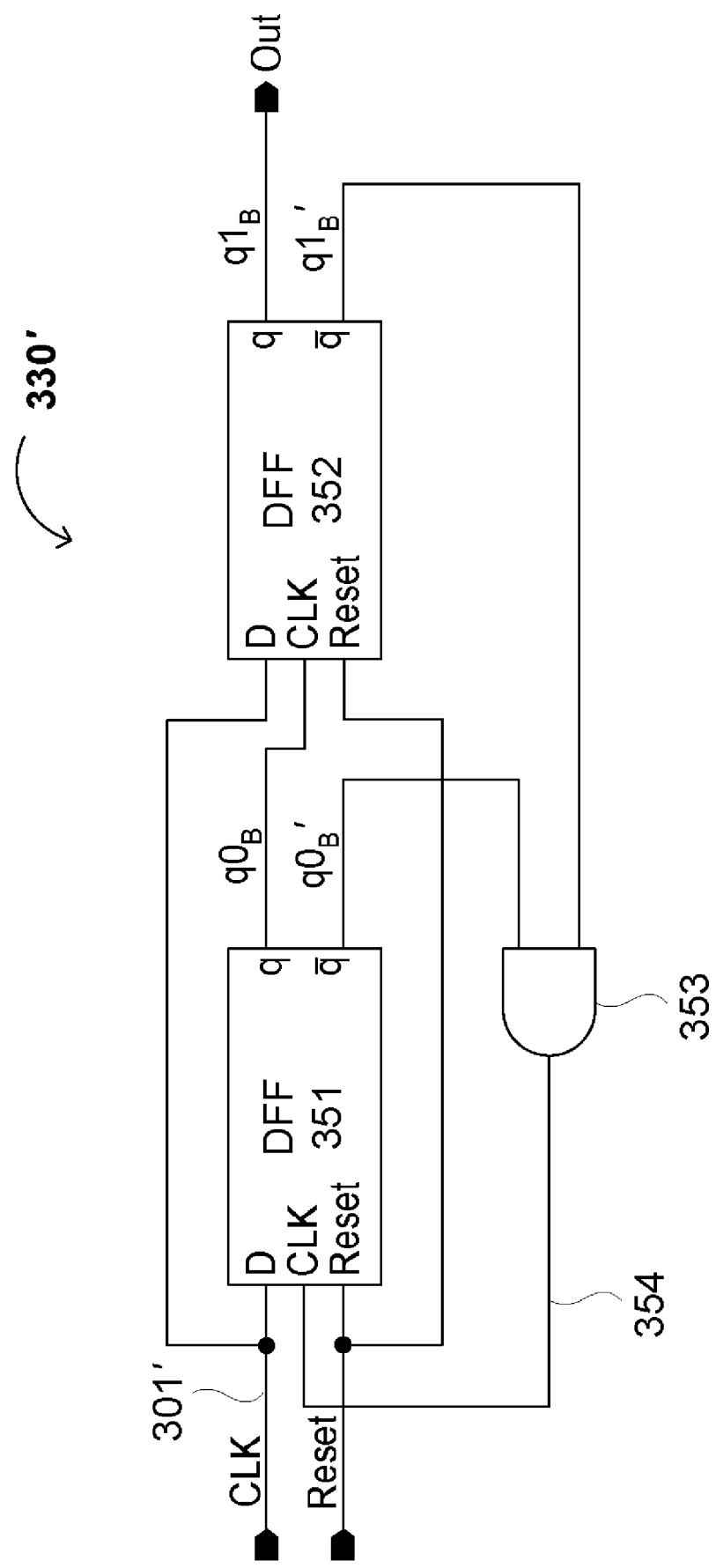
FIG. 3B is a circuit diagram of an exemplary second frequency divider according to the present invention.

For example, referring now to FIG. 3B, second frequency divider 330' may comprise only two D-type flip-flops (DFFs) 351 and 352 when the maximum odd divider ratio is three. In second frequency divider 330', the coupling circuit is configured to couple the DFFs in substantially the same way as in coupling circuit 306 of the first frequency divider for the same odd divider ratios. In this case, frequency divider 330' includes AND logic gate 353 configured to couple negative outputs $q0_B'$ and $q1_B'$ of DFFs 351 and 352, respectively, to the D input of first DFF 351. More generally, when integer divide ratio K is odd, coupler circuit 306 of the first frequency divider may be configured to couple the negative outputs of a Jth one and a (J+1)th one of the N D-type flip-flops of delay elements 305 to the first delay element (e.g., first DFF 311) through an AND logic gate, where J=(K−1)/2. Similarly, in the second frequency divider, a coupler circuit may be configured to couple the negative outputs of a Jth one and a (J+1)th one of the M DFFs to the first one of the DFFs through an AND logic gate (e.g., AND gate 353 of FIG. 3B). Thus, with a minimum odd divide ratio K of three, J has a minimum value of one (e.g., for a divide ratio of three, negative outputs of the first and second delay elements of each delay block are coupled to the respective delay block inputs).

Referring again to FIG. 4G, waveform 402 represents the inverted input clock signal 301'. Waveforms 473 and 474 represent the positive outputs $q0_B$ and $q1_B$ of DFFs 351 and 352, respectively. Waveform 475 represents the coupler output signal 354, provided by AND gate 353 having inputs coupled to negative outputs $q0_B'$ and $q1_B'$ of DFFs 351 and 352, respectively. Similar to waveforms 470 and 471, as can be seen in waveforms 473 and 474, the outputs of DFFs 351 and 352 are signals having a frequency that are one-third of the input clock frequency but without duty cycles of 50%.

In order to produce an odd-divided waveform having a 50% duty cycle, an output of the first frequency divider can be coupled with an output of second frequency divider 330. For example, when the divider ratio is three, an inverted output $q1_A'$ of the second DFF 312 (e.g., the positive output $q1_A$ of DFF 312 after passing through NAND gate 334 when the "Div03" signal is high) of the first frequency divider can be combined with an inverted output $q1_B'$ of the second DFF 352 (e.g., the positive output $q1_B$ of DFF 352 after passing through NAND gate 331 when the "Div03" signal is high) of second frequency divider 330' of FIG. 3B at NAND gate 332. Referring again to FIG. 4G, waveform 476 is the inverted output $q0_B'$ of the second DFF 351 and waveform 477 is the inverted output $q1_B'$ of the second DFF 352. Waveform 478 is the output of NAND gate 332, having a duty cycle of 50%.

The DFFs of the second delay block (e.g., DFFs 351 and 352) are triggered only on a rising edge (or only on a falling edge, depending on the configuration of the DFFs) of the inverted clock signal 301', while the DFFs of the first delay block (e.g., DFFs 311 and 312 of FIG. 3A) are triggered by the same (rising or falling) edge of the non-inverted clock signal 301 of FIG. 3A. Thus, the duty cycle of the output signal 478 may depend in part on the duty cycle of the input clock (e.g., the duty cycle of the output signal may not be 50% when the duty cycle of the input clock is not 50%) when the divide ratio is odd. However, the output duty cycle for odd divide ratios is generally improved over the duty cycle of the input clock (e.g., the output duty cycle is closer to 50% than the input duty cycle). For example, when the input clock cycle is 33% the output clock duty cycle is generally better than 45% for a divide ratio of three.

Multiplexer 333 may then be used to select the combined output when the integer divider ratio is odd, and to select the output of the first frequency divider only when the integer divider ratio is even, and produce divided output 302 having a 50% duty cycle for any integer divider ratio.

Similar results can be achieved for any other odd integer divider ratio. When integer divider ratio K is odd, output selector circuit 240 may be configured to perform a NAND logical operation on an inverted output of the Jth delay element of the first frequency divider and an inverted output of a Jth delay element of the second frequency divider, as long as J is the same position in each series of delay elements. A person skilled in the art can design appropriate logic and/or circuits to implement a clock divider circuit according to the present invention for any range of even and odd integer divider values.

An Exemplary Method

Figure 5:
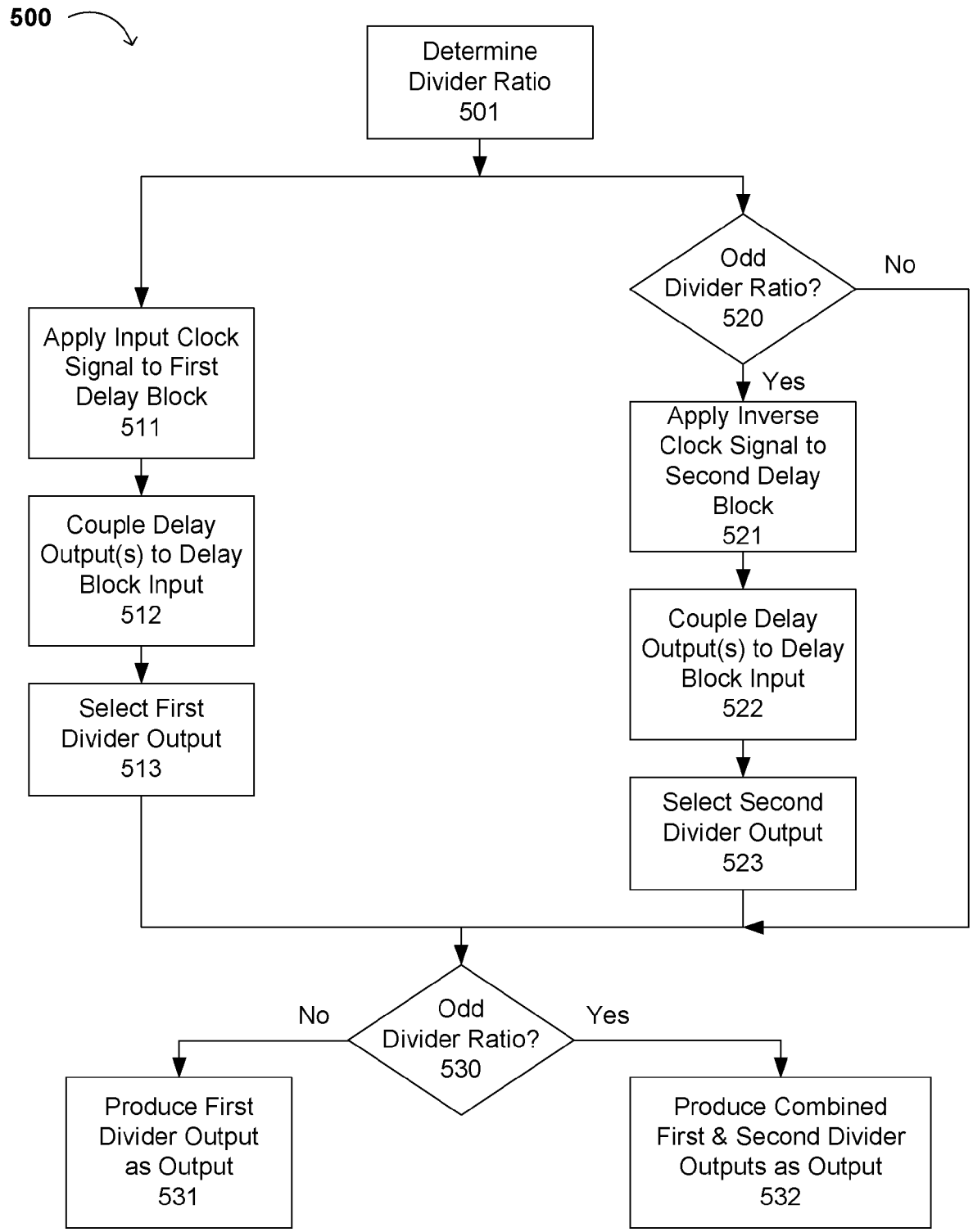
FIG. 5 is a diagram showing an exemplary method according to the present invention.

Referring now to FIG. 5, a flow chart of an exemplary method according to the present invention is shown. At step 501, the method includes determining a divider ratio. For example, the method may include receiving a signal or reading a value from a data storage device corresponding to a desired integer divider ratio. Steps 511 to 513 comprise producing a first divider output according to the desired integer divider ratio. At step 520, it is determined whether the selected integer divider ratio is odd. If so, then steps 521-523 comprise producing a second divider output. At step 530, it is again determined whether the divider ratio is odd. If so, step 532 comprises selecting the first divider output from a second output of the first plurality of delay elements and the second divider output from a second output of the second plurality of delay elements and producing the frequency divided output signal. If the divider ratio is even, step 531 comprises producing the first divider output as the frequency divided output signal.

To produce the first divider output, step 511 comprises applying the input signal (e.g., input clock signal 201 of FIG. 2) to a first delay block (e.g., a first delay block 211 having a plurality of serially connected delay elements). Step 512 comprises selectively coupling (e.g., using first configurable coupler 212) one or more first outputs of the first delay block to a first delay block input (e.g., an input of a first delay element in the first delay block). Step 513 comprises selecting the first divider output from a second output of the first delay block.

To produce the second divider output when the programmable integer divider value is odd, step 521 comprises applying an inverse of the input signal (e.g., inverted clock signal 203) to a second delay block (e.g., a second delay block 221 having a plurality of serially connected delay elements). Step 522 comprises selectively coupling (e.g., using second configurable coupler 222) one or more first outputs of the second delay block to second delay block input (e.g., an input of a first delay element in the second delay block). Step 523 comprises selecting the second divider output from a second output of the second delay block.

Step 520 may further comprise deactivating the second delay block when the selected integer divider value is even, for example by deactivating the inverse of the input signal (e.g., by deactivating inverter 202 of FIG. 2). The selected integer divider ratio may be represented by the symbol K. The first delay block used in steps 511 to 513 may comprise N D-type flip-flops (e.g., the six D-type flip-flops 311-316 of delay block 305 in FIG. 3A), where N is an integer of at least 2, and the second delay block used in steps 521 to 523 may comprise M D-type flip-flops (e.g., the two D-type flip-flops 351 and 352 of second divider circuit 330' in FIG. 3B), where M is an integer of at least 2 and M≦N. In this configuration, K has a maximum value of N×2 and a maximum odd value of (M×2)−1.

When K is even, step 512 may comprise coupling an output of an Ith one of the N D-type flip-flops to the first delay block input, where I=K/2. The Ith output may be coupled to the first delay block input by activating an inverter in response to the selected integer divider value, where the inverter has an input coupled to the Ith output and an output coupled to the first delay block input. For example, referring now to FIG. 3A, an Ith output may be selected by activating a tri-state inverter 319, 324, 326, 320, 323, or 325, corresponding to a selected divider ratio of 2, 4, 6, 8, 10, or 12, respectively.

When K is odd, step 512 may comprise coupling negative outputs of a Jth one and a (J+1)th one of the N D-type flip-flops to the first delay block input; and step 522 may comprise coupling negative outputs of a Jth one and a (J+1)th one of the M D-type flip-flops to the input of the second delay block input, where J=(K−1)/2. More specifically, step 512 may comprise (1) performing a first AND logical operation on negative outputs of a Jth one and a (J+1)th one of the N D-type flip-flops, and (2) providing an output of the first AND operation or a derivative thereof to the first delay block input, and step 522 may comprise (1) performing a second AND logical operation on negative outputs of a Jth one and a (J+1)th one of the M D-type flip-flops, and (2) providing an output of the second AND operation or a derivative thereof to the second delay block input.

For example, referring now in part to FIGS. 3A and 3B, when the divider ratio is three, step 512 of FIG. 5 may comprise coupling the negative outputs of D-type flip-flop (DFF) 311 and 312 to NAND gate 321 and coupling the output of NAND gate 321 to the input first DFF 311 through tri-state inverter 322 (thus performing a logical AND operation), and step 522 may comprise coupling the negative outputs of DFFs 351 and 352 to AND gate 353 and coupling the output of AND gate 353 to the input first DFF 351.

Step 532 (when K is odd) may include performing a NAND logical operation (e.g., with NAND gate 332 of FIG. 3A) on the first divider output and the second divider output and producing an output of the NAND logical operation or a derivative thereof as the frequency divided output signal (e.g., by selecting the output of NAND gate 332 at multiplexer 333 when the selected integer divider ratio is odd). Step 531 (when K is even) may comprise producing the first divider output or a derivative thereof as the frequency divided output signal (e.g., by selecting first divider output 309 at multiplexer 333 when the selected integer divider ratio is even).

CONCLUSION/SUMMARY

Thus, the present invention provides circuits and methods for dividing a frequency of an input signal by an integer divider value. The present invention advantageously provides for a frequency divider structure that can be easily programmed to provide any integer divide ratio with a 50% duty cycle. The circuits and methods can be implemented using standard logic cells such as D-type flip-flops and basic logic gates, and can be easily scaled to provide any integer divide ratio that is desired.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A circuit for dividing a frequency of an input signal by an integer divider value of at least two, said circuit comprising:
    a) a first frequency divider, including (i) a first plurality of serially connected delay elements configured to receive said input signal and (ii) a first configurable coupling circuit configured to couple one or more first outputs of said first plurality of delay elements to an input of a first of said first plurality of delay elements;
    b) a second frequency divider, including (i) a second plurality of serially connected delay elements configured to receive an inverse of said input signal and (ii) a second configurable coupling circuit configured to couple one or more first outputs of said second plurality of delay elements to an input of a first of said second plurality of delay elements;
    c) configurable logic configured to select a second output of said first plurality of delay elements and a second output of said second plurality of delay elements and producing a frequency divided output signal; and
    d) a programmable circuit configured to selectably configure said first and second configurable coupling circuits and said configurable logic.

2. The circuit of claim 1, wherein each of said serially connected delay elements of said second frequency divider is substantially identical to each of said serially connected delay elements of said first frequency divider.

3. The circuit of claim 1, wherein each of said serially connected delay elements of said second frequency divider is substantially identical to a corresponding one of said serially connected delay elements of said first frequency divider.

4. The circuit of claim 1, wherein said configurable logic is configured to disable said second frequency divider when said integer divider value is even.

5. The circuit of claim 1, wherein said configurable logic is configured to disable said inverse of said input signal when said integer divider value is even.

6. The circuit of claim 1, wherein said configurable logic further comprises a combination circuit configured to combine said second output of said first plurality of delay elements and said second output of said second plurality of delay elements to produce a combined output.

7. The circuit of claim 6, wherein said configurable logic further comprises a multiplexer configured to output said combined output signal as said frequency divided output signal when said integer divider value is odd and to output said second output of said first plurality of delay elements when said integer divider value is even.

8. The circuit of claim 6, wherein said combination circuit comprises a NAND logic gate having a first input coupled to said second output of said first plurality of delay elements or a derivative thereof, a second input coupled to said second output of said second plurality of delay elements or a derivative thereof, and an output configured to produce said combined output.

9. The circuit of claim 1, wherein:
    said first plurality of serially connected delay elements comprises N D-type flip-flops, where N is an integer of at least 2;
    said second plurality of serially connected delay elements comprises M D-type flip-flops, where M is an integer of at least 2 and less than or equal to N; and
    said integer divider value has a maximum value of N×2 and a maximum odd value of no more than (M×2)−1.

10. The circuit of claim 9, wherein said integer divider value is K and:
    when K is even, said one or more first outputs of said first plurality of delay elements comprises an output of an Ith one of said N D-type flip-flops, where I=K/2; and
    when K is odd, said one or more first outputs of said first plurality of delay elements comprises negative outputs of a Jth one and a (J+1)th one of said N D-type flip-flops, said one or more first outputs of said second plurality of delay elements comprises negative outputs of a Jth one and a (J+1)th one of said M D-type flip-flops, and J=(K−1)/2.

11. The circuit of claim 10, wherein, when K is odd:
    said first configurable coupling circuit is configured to couple said negative outputs of said Jth one and said (J+1)th one of said N D-type flip-flops to said input of said first of said first plurality of delay elements through an AND logic gate; and said second configurable coupling circuit is configured to couple said negative outputs of said Jth one and said (J+1)th one of said M D-type flip-flops to said input of said first of said second plurality of delay elements through an AND logic gate.

12. The of claim 10, wherein, when K is even:
said first configurable coupling circuit is configured to couple said output of said Ith one of said N D-type flip-flops to said input of said first of said first plurality of delay elements through an inverter.

13. The circuit of claim 1, wherein, when said integer divider value is even, said frequency divided output signal has a duty cycle of 50% independent of a duty cycle of said input signal.

14. The circuit of claim 1, wherein when said integer divider value is odd, said frequency divided output signal has a duty cycle of 50% when a duty cycle of said input signal is 50%.

15. The circuit of claim 1, wherein when said integer divider value is odd and said input signal has a duty cycle that is not 50%, said frequency divided output signal has a duty cycle that is closer to 50% than said duty cycle of said input signal.

16. The circuit of claim 15, wherein when said integer divider value is three and said input signal has a duty cycle of 33%, said frequency divided output signal has a duty cycle of at least 45%.

17. A method of dividing a frequency of an input signal by a selected integer divider value of at least two, said method comprising:
(a) producing a first divider output by (i) applying said input signal to first delay block comprising a first plurality of serially connected delay elements, (ii) selectively coupling one or more first outputs of said first delay block to a first delay block input comprising an input of a first delay element in said first delay block, and (iii) selecting said first divider output from a second output of said first delay block;
(b) when said programmable integer divider value is odd, producing a second divider output by (i) applying an inverse of said input signal to a second delay block comprising a second plurality of serially connected delay elements, (ii) selectively coupling one or more first outputs of said second delay block to a second delay block input comprising an input of a first delay element in said second delay block, and (iii) selecting said second divider output from a second output of said second delay block; and
(c) producing a frequency divided output signal based on said first divider output and/or said second divider output in accordance with said integer divider value.

18. The method of claim 17, further comprising receiving a selection signal corresponding to said selected integer divider value.

19. The method of claim 17, further comprising deactivating said second delay block when said selected integer divider value is even.

20. The method of claim 17, further comprising deactivating said inverse of said input signal when said selected integer divider value is even.

21. The method of claim 17, wherein:
K is said selected integer divider value;
said first delay block comprises N D-type flip-flops, wherein N is an integer of at least 2;
said second delay block comprises M D-type flip-flops, where M is an integer of at least 2 and M≦N; and
K has a maximum value of N×2 and a maximum odd value of (M×2)−1.

22. The method of claim 20, when K is even, step (a)(ii) comprises coupling an output of an Ith one of said N D-type flip-flops to said first delay block input, where I=K/2.

23. The method of claim 21, wherein when K is even, step (a)(ii) further comprises activating an inverter in response to said selected integer divider value, wherein said inverter has an input coupled to said output of said Ith one of said N D-type flip-flops and an output coupled to said first delay block input.

24. The method of claim 22, wherein said inverter comprises a tri-state inverters.

25. The method of claim 20, wherein when K is odd:
step (a)(ii) comprises coupling negative outputs of a Jth one and a (J+1)th one of said N D-type flip-flops to said first delay block input; and
step (b)(ii) comprises coupling negative outputs of a Jth one and a (J+1)th one of said M D-type flip-flops to said input of said second delay block input;
where J=(K−1)/2.

26. The method of claim 20, wherein when K is odd:
step (a)(ii) comprises (1) performing a first AND logical operation on negative outputs of a Jth one and a (J+1)th one of said N D-type flip-flops, and (2) providing an output of said first AND operation or a derivative thereof to said first delay block input; and
step (b)(ii) comprises (1) performing a second AND logical operation on negative outputs of a Jth one and a (J+1)th one of said M D-type flip-flops, and (2) providing an output of said second AND operation or a derivative thereof to said second delay block input;
whereJ=(K−1)/2.

27. The method of claim 20, wherein when K is odd, step (c) further comprises performing a NAND logical operation on said first divider output and said second divider output and producing an output of said NAND logical operation or a derivative thereof as said frequency divided output signal.

28. The method of claim 20, wherein when K is even, step (c) further comprises producing said first divider output or a derivative thereof as said frequency divided output signal.

29. The method of claim 17, wherein, when said selected integer divider value is even, said frequency divided output signal has a duty cycle of 50% independent of a duty cycle of said input signal.

30. The method of claim 17, wherein when said selected integer divider value is odd, said frequency divided output signal has a duty cycle of 50% when a duty cycle of said input signal is 50%.

31. The method of claim 17, wherein when said selected integer divider value is odd and said input signal has a duty cycle that is not 50%, said frequency divided output signal has a duty cycle that is closer to 50% than said duty cycle of said input signal.

32. The method of claim 31, wherein when said integer divider value is three and said input signal has a duty cycle of 33%, said frequency divided output signal has a duty cycle of at least 45%.

* * * * *